United States Patent
Raley et al.

(10) Patent No.: US 11,227,767 B2
(45) Date of Patent: Jan. 18, 2022

(54) CRITICAL DIMENSION TRIMMING METHOD DESIGNED TO MINIMIZE LINE WIDTH ROUGHNESS AND LINE EDGE ROUGHNESS

(71) Applicant: Tokyo Electron Limited, Tokyo (JP)

(72) Inventors: Angelique Raley, Albany, NY (US);
Kal Subhadeep, Albany, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/401,527

(22) Filed: May 2, 2019

(65) Prior Publication Data
US 2019/0341257 A1 Nov. 7, 2019

Related U.S. Application Data

(60) Provisional application No. 62/666,129, filed on May 3, 2018, provisional application No. 62/688,754, filed on Jun. 22, 2018.

(51) Int. Cl.
*H01L 21/033* (2006.01)
*H01L 21/311* (2006.01)

(52) U.S. Cl.
CPC ...... *H01L 21/0338* (2013.01); *H01L 21/0332* (2013.01); *H01L 21/0335* (2013.01); *H01L 21/0337* (2013.01); *H01L 21/31116* (2013.01); *H01L 21/31144* (2013.01)

(58) Field of Classification Search
CPC combination set(s) only.
See application file for complete search history.

(56) References Cited

U.S. PATENT DOCUMENTS

| | | | |
|---|---|---|---|
| 7,256,135 B2 | 8/2007 | Kushibiki et al. | |
| 7,846,645 B2 | 12/2010 | Urakawa | |
| 8,334,083 B2 | 12/2012 | Luong et al. | |
| 9,034,723 B1* | 5/2015 | Shieh | H01L 21/31055 |
| | | | 438/424 |
| 9,431,486 B1* | 8/2016 | Ok | H01L 27/0924 |
| 9,437,447 B2 | 9/2016 | Devilliers | |
| 10,096,524 B1* | 10/2018 | Bi | H01L 21/3065 |
| 2009/0155731 A1 | 6/2009 | Urakawa | |
| 2016/0379835 A1 | 12/2016 | Kal et al. | |
| 2017/0243744 A1 | 8/2017 | Luong et al. | |
| 2017/0256395 A1 | 9/2017 | Raley et al. | |
| 2018/0315601 A1* | 11/2018 | Peng | H01L 21/0276 |
| 2019/0067096 A1* | 2/2019 | Huang | H01L 21/76816 |

* cited by examiner

*Primary Examiner* — Ratisha Mehta
(74) *Attorney, Agent, or Firm* — Weihrouch IP

(57) ABSTRACT

A substrate is provided with a patterned layer over a stack of one or more processing layers. The processing layers include at least one patterned layer and one etch target layer. CD trimming between the CD of the patterned layer and the CD of the etch target layer may be achieved after the pattern is transferred to the etch target layer. After the etch target layer is patterned, a plasma free gas phase etch process may be used to trim the CD of the etch target layer to finely tune the CD. In an alternate embodiment, plasma etch trim processes may be used in combination with the gas phase etch process. In such an embodiment, partial CD trimming may be achieved via the plasma etching of the various process layers and then additional CD trimming may be achieved by subjecting the etch target layer to the plasma free gas phase etch after the desired pattern has been formed in the etch target layer.

19 Claims, 8 Drawing Sheets

CRITICAL DIMENSION TRIMMING METHOD DESIGNED TO MINIMIZE LINE WIDTH ROUGHNESS AND LINE EDGE ROUGHNESS

CROSS-REFERENCE TO RELATED APPLICATIONS

This application claims priority to U.S. Provisional Patent Application No. 62/666,129, entitled "CD Trimming Method Designed To Minimize Line Width Roughness and Line Edge Roughness", filed May 3, 2018 and U.S. Provisional Patent Application No. 62/688,754, entitled "Critical Dimension Trimming Method Designed To Minimize Line Width Roughness and Line Edge Roughness", filed Jun. 22, 2018; the disclosure of which is expressly incorporated herein, in its entirety, by reference.

BACKGROUND

The present disclosure relates to the processing of substrates, such as for example, semiconductor substrates. In particular, it provides a novel method to pattern substrates utilizing very narrow pitch techniques, such for example, used in extreme ultraviolet (EUV) lithography and/or multiple patterning schemes such as self-aligned double patterning (SADP), self-aligned triple patterning (SATP), self-aligned quadruple patterning (SAQP), etc.

As geometries in substrate processing continue to shrink, the technical challenges to forming structures on substrates via photolithography techniques increase. As requirements for 52 nm and lower pitch structures arose, a variety of photolithography techniques have been utilized for achieving suitable photolithography for such narrow pitches including EUV lithography (lithography utilizing wavelengths of light in the EUV range, most typically 13.5 nm wavelengths) and/or multiple patterning schemes. To achieve such small dimensions, conventional techniques utilize a photo resist critical dimension (CD) transfer scheme in which photo resist is patterned to certain dimensions and then a plasma etch trim process is utilized upon a stack of underlying layers. The plasma etch trim process provides an ultimate critical dimension in a targeted etch layer (the layer desired to be patterned) that has a linewidth critical dimension that is smaller than the critical dimension as originally patterned in the photo resist. For example, a conventional lithography stack may involve the use of a patterned photo resist formed over an anti-reflective layer, a planarization layer (for example spin on carbon, chemical vapor deposition (CVD) deposited carbon, or other organic planarization layers), and a targeted etch layer. Such targeted etch layers may be include mandrel layers or core layers. Exemplary materials for targeted etch layers include, for example, silicon, silicon nitride and silicon oxide, though other materials may be utilized. To reach the target CD in the mandrel or core layer, typically the CD of the photo resist layer is trimmed by controlling a plasma etch to provide a desired amount of trim during the etching of the various intervening layers of the lithography stack underlying the photo resist.

It has been found that as pitches decrease, particularly pitches approaching 30 nm or less, line width roughness (LWR) and line edge roughness (LER) performance degrades during the pattern transfer process used to trim CDs. Further, it has been found that such degradation caused by trimming is particularly problematic as a result of the aspect ratios and materials required in small pitch processes. For example, FIG. 1 illustrates a top view of a portion of a patterned substrate 100 having degraded lines 105. As shown, LWR/LER degradation of a conventional process is illustrated by the degraded lines 105 having "wiggle" in a pattern transferred to silicon nitride mandrels.

It would be desirable to provide a lithography integration technique that reduces LWR and/or LER degradation during CD trimming.

SUMMARY

Described herein is an innovative method to implement CD trimming control. A substrate is provided with a patterned layer, such as for example, a photo resist layer, over a stack of one or more processing layers. The one or more processing layers include a etch target layer, which in one embodiment may be a mandrel layer, CD trimming between the CD of the patterned layer and the CD of the etch target layer may be achieved after the pattern is transferred to the etch target layer, More specifically, after the etch target layer is patterned, a plasma free, gas phase etch process may be used to trim the CD of the etch target layer to finely tune the CD. In an alternate embodiment, plasma etch trim processes may be used in combination with the gas phase etch process. In such an embodiment, partial CD trimming may be achieved via the plasma etching of the various process layers and then additional CD trimming may be achieved by subjecting the etch target layer to the plasma free gas phase etch after the desired pattern has been formed in the etch target layer. In one embodiment, an etch stop layer underlies the etch target layer and the plasma free gas phase etch is selective to the etch stop layer.

In one embodiment, a method for processing a substrate is provided. The method may comprise providing the substrate with a plurality of first patterned structures and a etch target layer underlying the first patterned structures, the first patterned structures having a first line width and first space width. The method further comprises etching the etch target layer to form a etch target layer structures corresponding to the first patterned structures. The method further comprises after etching the etch target layer, trimming the etch target layer structures to reduce a critical dimension of the plurality of etch target layer structures such that the plurality of etch target layer structures have a second line width and second space width, the second line width being less than the first line width of the plurality of first patterned structures. Further, the trimming the etch target layer is performed with an isotropic gaseous chemical removal process.

In another embodiment, a method for processing a substrate is provided. The method comprises providing a resist layer having patterned resist structures and providing an underlayer, a carbon-containing layer, an etch target layer, and an etch stop layer. The method further comprises performing an underlayer open process, the underlayer open process transferring a resist pattern of the resist layer into the underlayer. The method also comprises performing a carbon-containing layer etch process, the carbon-containing layer etch process removing the resist layer and transferring an underlayer pattern into the carbon-containing layer. The method further comprises performing an etch target layer open process, the etch target layer open process removing the carbon-containing layer and transferring the resist pattern into the etch target layer. The method also comprises performing a gas phase non-plasma critical dimension trim process to trim a target structure above the etch stop layer.

In another embodiment a method for processing a substrate is provided. The method comprises providing the substrate with first patterned structures and an etch target layer underlying the first patterned structures, the first patterned structures having a first critical dimension. The method further comprises etching the etch target layer to form target structures corresponding to the first patterned structures, After etching the etch target layer, the method comprises trimming the target structures with multiple cycles of a plasma free gas phase etch process, wherein a target structure critical dimension is reduced from the first critical dimension by the trimming.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Described herein is an innovative method to implement CD trimming control. A substrate is provided with a patterned layer, such as for example, a photo resist layer, over a stack of one or more processing layers. The one or more processing layers include a etch target layer, which in one embodiment may be a mandrel layer. CD trimming between the CD of the patterned layer and the CD of the etch target layer may be achieved after the pattern is transferred to the etch target layer. More specifically, after the etch target layer is patterned, a plasma free gas phase etch process may be used to trim the CD of the etch target layer to finely tune the CD. In an alternate embodiment, plasma etch trim processes may be used in combination with the gas phase etch process. In such an embodiment, partial CD trimming may be achieved via the plasma etching of the various process layers and then additional CD trimming may be achieved by subjecting the etch target layer to the plasma free gas phase etch after the desired pattern has been formed in the etch target layer. In one embodiment, an etch stop layer underlies the etch target layer and the plasma free gas phase etch is selective to the etch stop layer.

Figure 4:
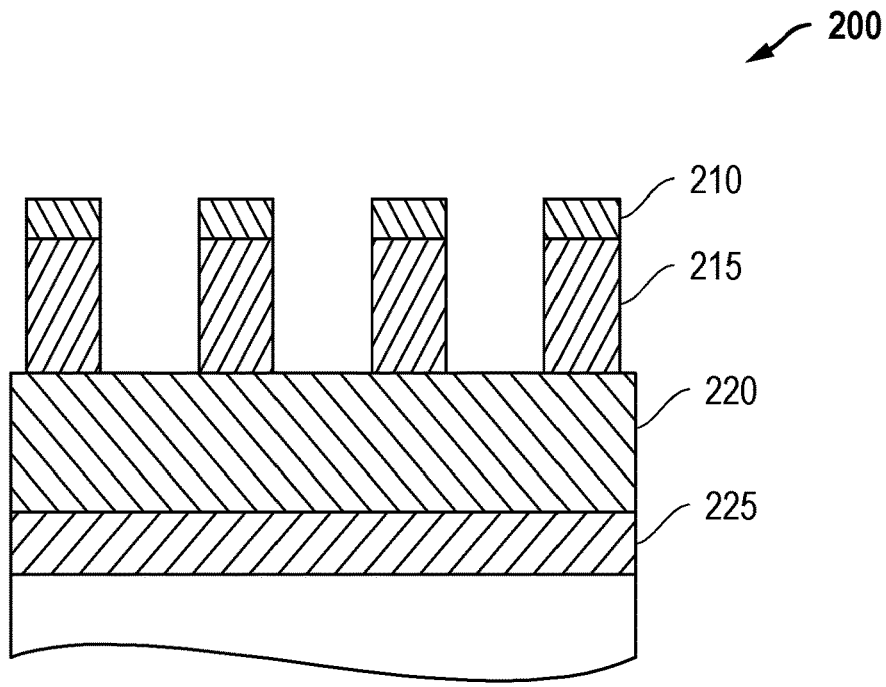
Figure 5:
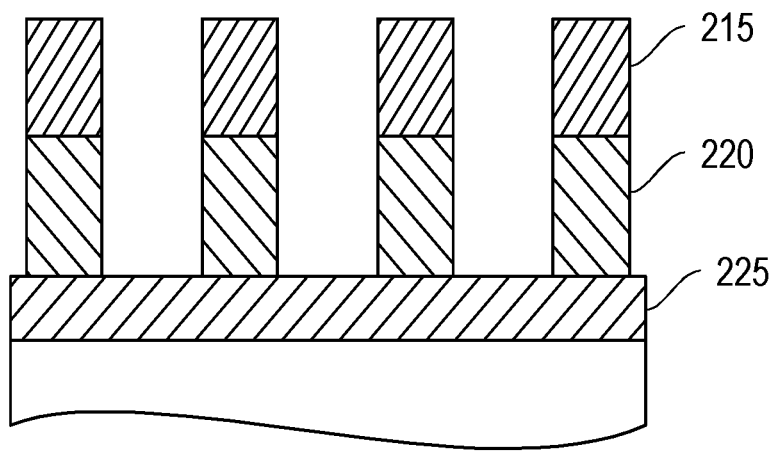
Figure 6:
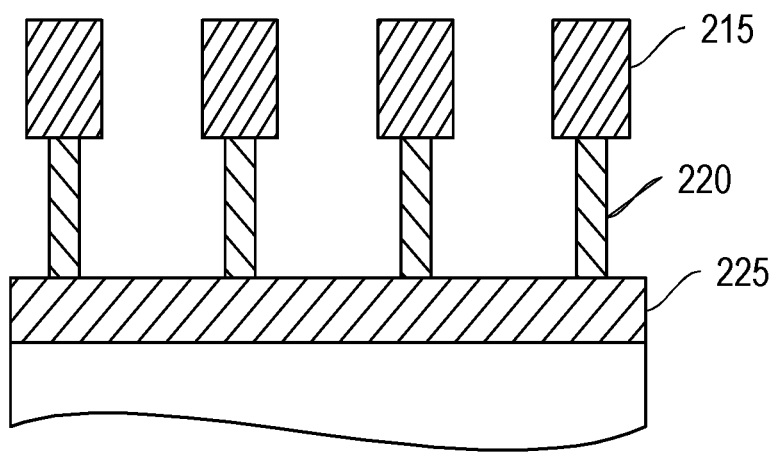
FIGS. 6-7 illustrate one embodiment for performing a trimming process on an etch target layer.
Figure 7:
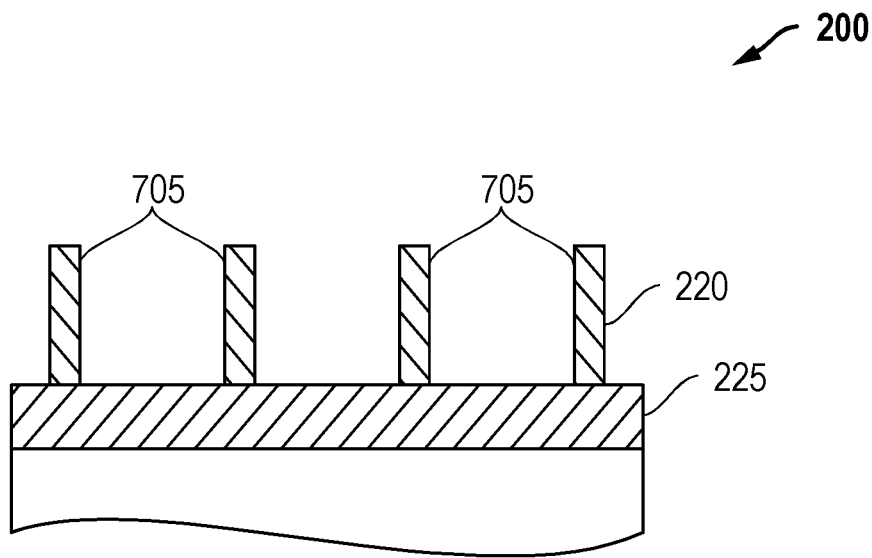
Figure 8:
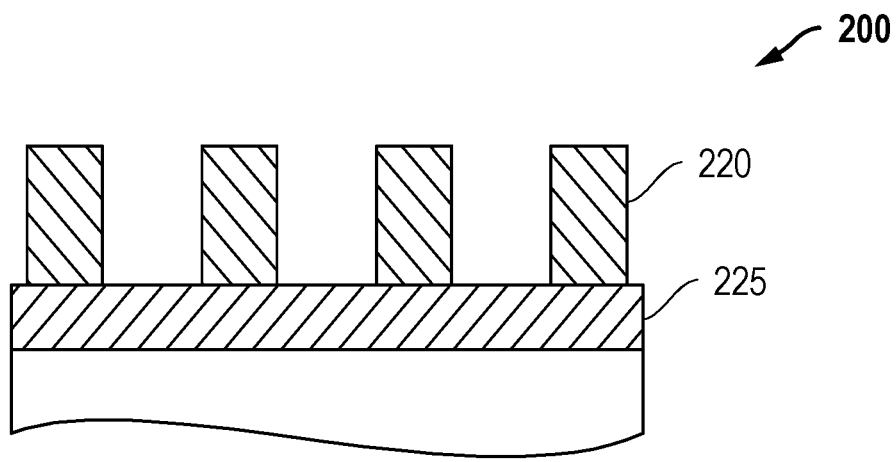
FIGS. 8-9 illustrate another embodiment for performing a trimming process on an etch target layer.
Figure 9:
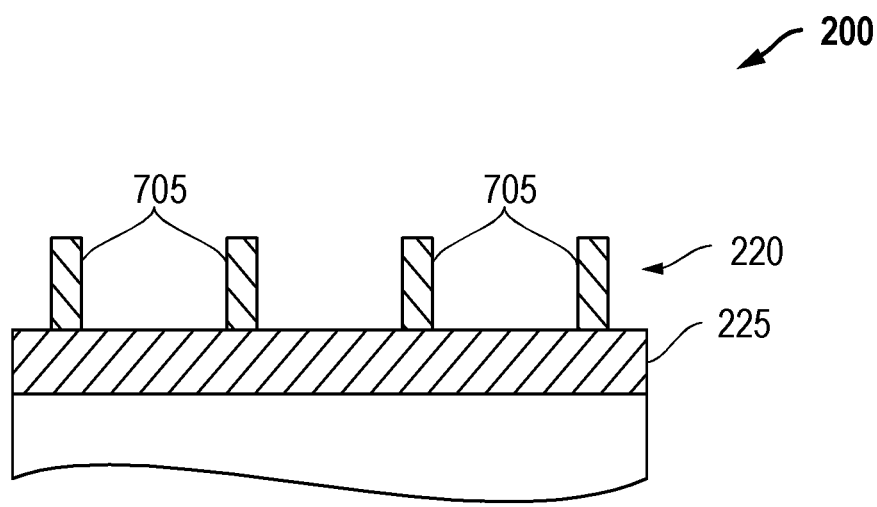

Multiple embodiments of a process integration flow utilizing an isotropic trim step are described in relation to the cross-sectional illustrations of FIGS. 2-9. As shown in FIGS. 2-5, an exemplary initial lithography process flow is described. FIGS. 6-7 illustrate one exemplary subsequent series of process steps for processing the structures provided at FIG. 5. FIGS. 8-9 illustrate another exemplary subsequent series of process steps for processing the structures provided at FIG. 4.

Figure 1:
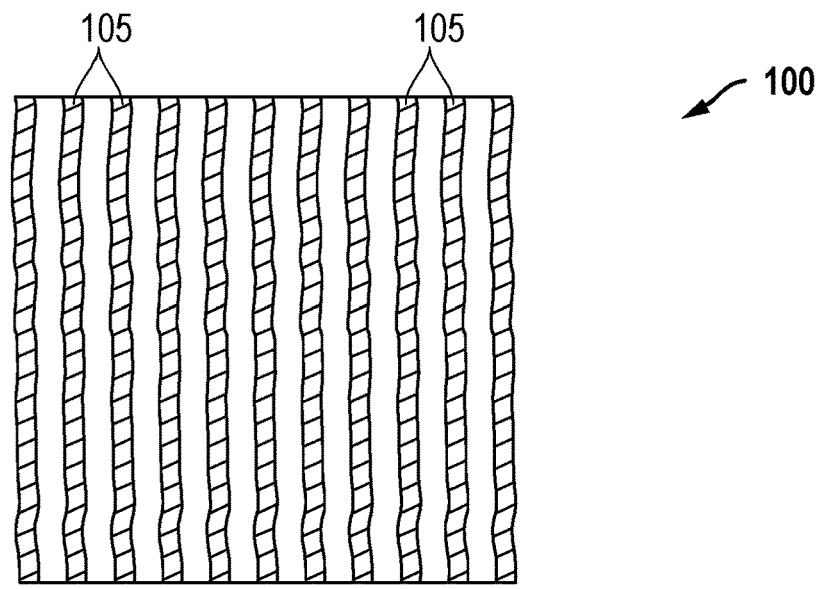
FIG. 1 illustrates a conventional structure having degraded patterned lines.
Figure 2:
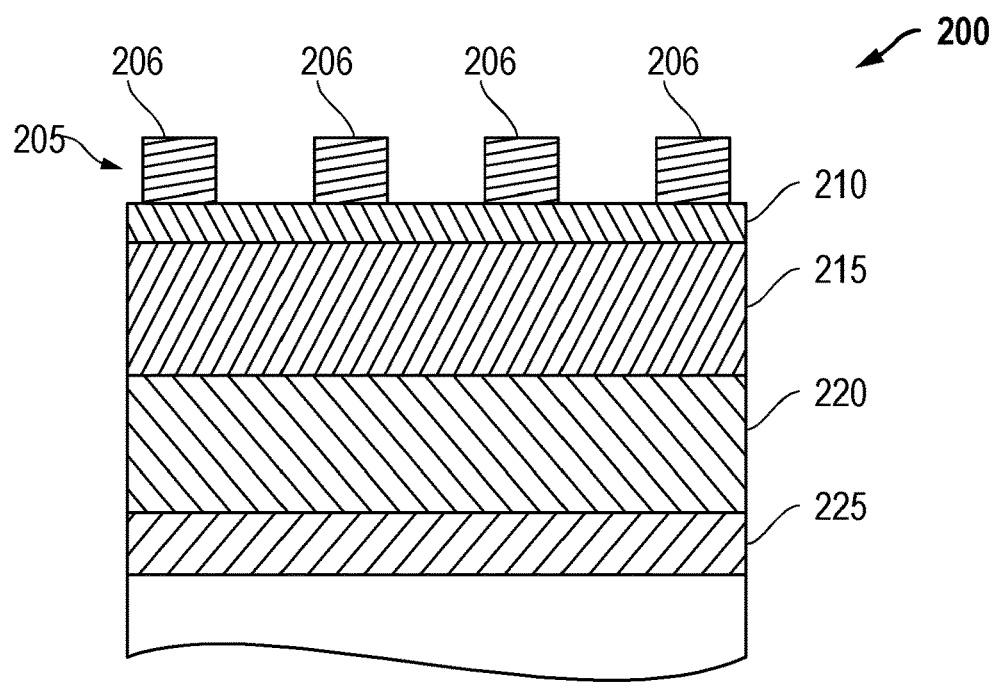
FIGS. 2-5 illustrate exemplary process steps to etch an etch target layer prior to a trimming step.

As shown in FIG. 2, a substrate 200 is provided. A resist layer 205 may be formed which has a plurality of patterned resist structures 206. The patterning of the resist layer 205 may be accomplished via any of a wide variety of photolithography techniques known in the art. In one exemplary embodiment, the patterned resist structures 206 of the resist layer 205 may be formed utilizing EUV lithography techniques. In one embodiment, the pattern may have a pitch of 52 nm or less and linewidths of 26 nm. It will be recognized that though the concepts described herein are provided with regard to EUV lithography techniques, the concepts described herein may be also applicable to other lithography techniques, including those with pitches narrower than those achievable with EUV lithography techniques. Thus, the use of the concepts described herein for the formation of structures having pitches of 52 nm or less through EUV lithography techniques will be recognized to be merely exemplary.

One or more other lithography layers may be provided between the resist layer 205 and etch target layer 220. It will be recognized that the particular layers and thicknesses shown and described with relation to FIG. 2 are merely exemplary and other layers and/or thicknesses may be utilized. Further, the techniques described herein may be utilized without the use of such other lithography layers. In one embodiment, an antireflective coating or resist underlayer 210 of 18 nm thickness may be provided under the patterned resist layer. Further an intervening layer 215, such as an organic planarization layer may be provided under the resist layer 205 (or under the antireflective coating or resist underlayer 210 if one is utilized). In one embodiment, the intervening layer 215 is an organic planarization layer. In another embodiment, the intervening layer 215 is a spin-on carbon layer of 60 nm thickness. In another embodiment, the intervening layer 215 is a CVD deposited carbon. Underlying the intervening layer 215 is an etch target layer 220. In one example, the etch target layer 220 may be a 60 nm thick mandrel layer. However, other etch target layers may be utilized. Underlying the etch target layer may be an etch stop layer 225.

The etch stop layer 225 may overlie other layers of the substrate 200. The substrate 200 may be any substrate for which the use of patterned features is desirable. For example, in one embodiment, substrate 200 may be a semiconductor substrate having one or more semiconductor processing layers formed thereon. In one embodiment, the substrate may be a substrate that has been subject to multiple semiconductor processing steps which yield a wide variety of structures and layers, all of which are known in the substrate processing art, and which may be considered to be part of the substrate. In one embodiment, the concepts disclosed herein may be utilized at a back end of line (BEOL) processing step. In another embodiment, the concepts disclosed herein may be utilized at a front end of line (FEOL) processing step. The techniques described herein may be utilized to provide etch target layer 220 linewidths which are narrower than those of the patterned resist structures 206 of the resist layer 205 by utilizing a CD trimming process as described herein.

As mentioned, one or more intervening lithography layers may be provided between the resist layer 205 and a etch target layer 220. It will be recognized that the particular stack of intervening lithography layers may vary while still obtaining the benefits of the concepts described herein. Thus, for example, more or less layers may be utilized. For example, an antireflective layer need not be utilized or multiple antireflective layers may be utilized (such as, for example, the use of both an antireflective coating (ARC)

layer and a bottom antireflective coating (BARC) layer). Further, the particular composition of each layer may vary and the layers may be deposited in a variety of manners, as would be recognized in the art. In one embodiment, for example, the intervening layer 215 may be a relatively thick layer which provides planarization benefits by planarizing step heights across the substrate 200. In this case, an intervening planarization layer is provided. In one embodiment, the planarization layer may be an organic planarization layer and, in another embodiment, it may be a spin on hard mask layer. It will be recognized, however, that other materials and thicknesses may be utilized for the intervening layer 215. In addition, other layers, including hard masks, etc. may be employed, all as would be recognized by those skilled in the art. The etch target layer 220 may be comprised of a wide variety of materials. In one embodiment, the etch target layer 220 may be silicon, silicon oxide, or silicon nitride. In another embodiment, the etch target layer 220 may be combinations of silicon, silicon oxide, or silicon nitride. It will be recognized that depending upon the particular substrate processing process within which the techniques disclosed herein are utilized, the etch target layer 220 may be comprised of any number of materials utilized in substrate processing.

As will be recognized, the etch stop layer 225 may be comprised of a wide range of materials. In one embodiment, the etch stop layer 225 is chosen of a material which would provide suitable etch selectivity between the etch stop layer 225 and the etch target layer 220. In one embodiment, the etch stop layer 225 may be comprised of silicon, silicon oxide or silicon nitride. In another embodiment the etch stop layer 225 may be comprised of titanium nitride. It will be recognized, though, that other etch stop materials, including organic materials, may be utilized. Thus, it will be recognized that the etch stop layer 225 may merely be a layer which provides a desired level of etch selectivity between the overlying layer(s) being etched and the etch stop layer. Further, in other embodiments, a separate etch stop layer may not even be utilized.

Figure 3:
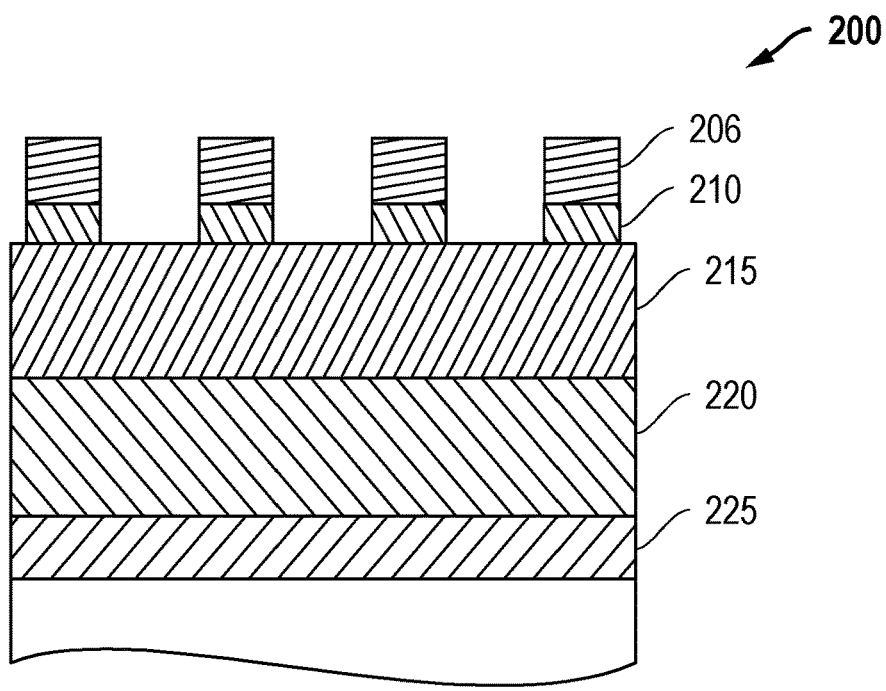

Processing of the structures shown in FIG. 2 may proceed to the state shown in FIG. 3 by opening the resist underlayer 210. Next the intervening layer 215 may be opened as shown in FIG. 4. Processing may then proceed to FIG. 5 in which the etch target layer 220 is opened as shown in FIG. 5.

The particular etches utilized to open the various layers will vary depending upon materials utilized. In one embodiment, some of the etches chosen may be plasma etches that will generally be relatively anisotropic etch processes. In one embodiment, the etch chemistries chosen may be a fluorocarbon based chemistry (CF4, CHF3, C4F8, SF6, CH2F2, etc.) for etching the resist underlayer 210, an oxygen or hydrogen based chemistry (CO2, O2, H2/N2, etc.) for etching the intervening layer 215, and a gas phase fluorine based chemistry (HF, NF3, F2) and nitrogen based gases (NH3, NF3, etc.) for etching the etch target layer 220. It will be recognized that the various etch steps shown in FIGS. 2-5 are well known and a wide range of etching techniques may be utilized. Further, the various etch steps may be performed separately or combined. In one embodiment, the etch techniques chosen may provide a CD in the etch target layer 220 that is relatively the same as the CD of the patterns in the resist layer 205. In another embodiment (not shown), some trimming of the CD may be obtained by the various process steps leading up to the structures shown in FIG. 5.

After the processing shown in FIG. 5, the structures formed are subjected to an isotropic etch in which the size of the structure formed in the etch target layer 220 may be trimmed a desired amount so that the pattern formed in etch target layer 220 is modified in a repeatable and well defined manner to be narrower than the initial pattern that was formed in the resist layer 205. In this manner, the CD may be trimmed in a manner without excessive LWR/LER degradation. In one embodiment, the isotropic etch may be an isotropic gaseous chemical removal process.

The process flow utilized to implement the trim techniques may vary. For example, the trim techniques may be accomplished after the processing of FIG. 5 by next performing the steps shown in FIGS. 6-7. Alternatively, the trim techniques may be accomplished after the processing of FIG. 5 by next performing the steps shown in FIGS. 8-9. As will be recognized by those in the art, other process flow embodiments may also benefit from the trim techniques described herein as the embodiments shown are only meant to be exemplary embodiments.

In one embodiment, after the processing shown in FIG. 5, the etch target layer 220 is subjected to an isotropic etch which will trim the linewidth of the structures formed in the etch target layer 220 as shown in FIG. 6. In the embodiment of FIGS. 6-7, the trim is performed as shown in FIG. 6 such that the structures in the etch target layer 220 have linewidths that are narrower than the linewidths of the patterned resist structures 206 in the resist layer 205. This method is also beneficial to maintain the height of layer 220, while simultaneously trimming the width.

In the embodiment of FIGS. 6-7, after the trimming of etch target layer 220 is performed as shown in FIG. 6, the intervening layer 215 may then be removed in a manner that does not significantly impact the patterning of the etch target layer 220. For example, if the intervening layer 215 is an organic planarization layer then an ash process (for example a plasma ash process) may be utilized to remove the intervening layer. At the point of processing shown in FIG. 7, target structures 705 are provided in the etch target layer 220 that can act as a desired structure for use in further processing of the substrate 200. For example, in one embodiment, the resulting target structures 705 may be mandrels. It will be recognized that such a use is merely exemplary and other uses of the resulting target structures 705 of FIG. 7 may be utilized after forming the desired pattern in an etch target layer 220 of a substrate 200 being processed. One advantage of the technique of FIGS. 6-7 is that portions of the intervening layer 215 remain overlying the etch target layer 220 during the etch target layer 220 trim process. This may aid in preventing corner rounding of the etch target layer 220, providing a more square shape to the target structures 705 for use as mandrels or other purposes.

In the embodiment of FIGS. 8-9, after the processing as shown in FIG. 5, the intervening layer 215 may be removed before the trimming step as shown in FIG. 8. Then, a trim may be performed on the etch target layer 220 to provide target structures 705 which have narrower linewidths than the original patterned resist structures as shown in FIG. 9.

In the embodiment of FIGS. 8-9, the trimming of etch target layer 220 is performed in FIG. 9, similar to as explained above with reference to FIG. 6. For the embodiment of FIGS. 8-9, the removal of the intervening layer is performed at FIG. 8, such as for example in one embodiment, through a plasma ash process as described above.

As described herein the reduction of the linewidths is performed by a trimming process that includes the use of a gas phase etch. The gas phase etch may be controlled in a highly controllable manner to provide fine adjustment to the critical dimensions formed. In one embodiment, the gas phase etch may be an etch that is performed in incremental cycles. In one example, the linewidth of the structures formed in the etch target layer may be reduced by increments of less than 1 nm to 5 nm per cycle up to 15 nm or more total reduction over multiple cycles. For example, in one embodiment, four cycles of the gas phase etch may be utilized. In another embodiment, six cycles of the gas phase etch may be utilized. The techniques provided herein advantageously allow accurate control of such fine reductions in linewidth in a well-controlled pattern that does not display significant LWR/LER degradation.

Figure 10:
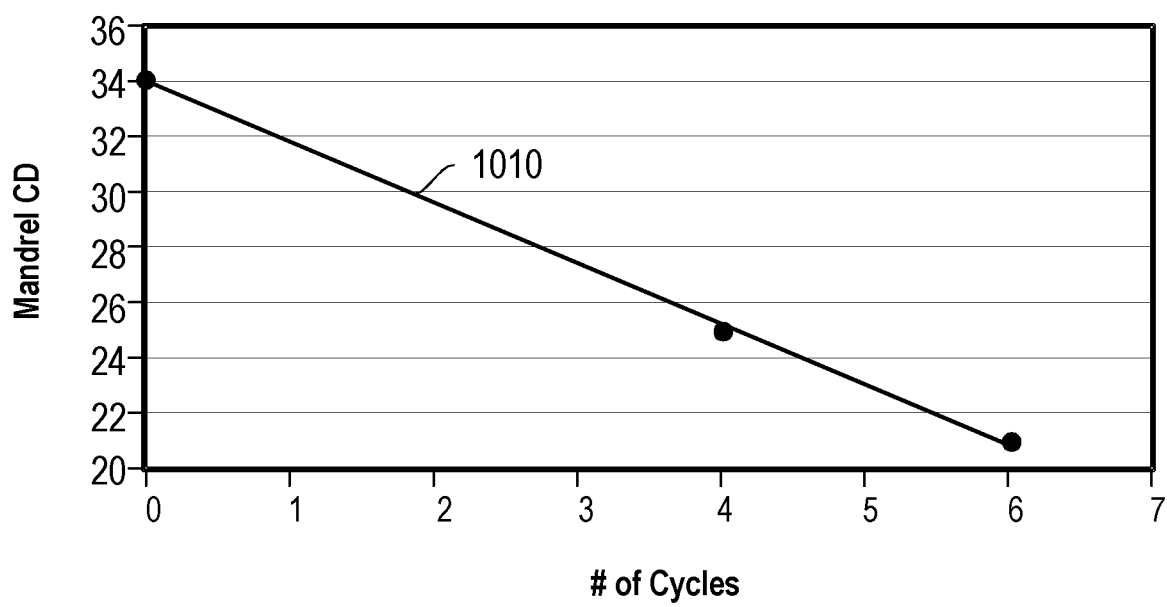
FIG. 10 is a graph illustrating critical dimension reduction as a function of the number of cycles of a gas phase etch.

Various isotropic etches may be utilized to perform the trimming of the etch target layer 220. In one embodiment a gaseous chemical etch may be utilized. Such an etch may be implemented in a manner to provide nanometer level control of the trimming process such that it is suitable for trimming patterned structures to the level of control described herein. In one embodiment, for a silicon nitride layer that is utilized for the etch target layer 220, a gaseous chemical removal process may be utilized. One exemplary gaseous chemical silicon nitride removal process is an ammonia (NH3) and fluorine containing gas process. For example, the process may involve first exposing the silicon nitride to ammonia to provide ammonia adsorption on the silicon nitride surface. Then the surface is exposed to a fluorine contain gas (for example hydrogen fluoride (HF) or nitrogen trifluoride (NF3)) so as to etch the structure to achieve the trimming effect. In such a process, the layer to be trimmed is exposed to a gaseous combination of ammonia and fluorine containing gas after which thermal treatment is applied to heat the layer being removed to aid in the chemical removal of the layer. In addition, inert gaseous such as nitrogen and argon may be added to the gaseous treatment. The chemical exposure and thermal heating provide a controllable reaction for removing the small amounts of the silicon nitride in the nanometer levels desired. Such gaseous chemical removal etches are known to those in the art. One exemplary process may include process conditions of pressures of 0-300 mT, gas flows of 0-3000 sccm N2 and 1-1000 sccm of NH3 and HF. An exemplary process and system for such gaseous chemical removal etches includes that disclosed in U.S. Published Patent Application No. US2016/0379835 entitled "Gas Phase Etching System and Method," to Kal et al., the disclosure of which is incorporated herein by reference in its entirety. One exemplary chart of the number of gas phase etch cycles and CD trimming achieved for a silicon nitride mandrel is shown in FIG. 10. As shown in FIG. 10, a graph line 1010 indicates the relationship between the mandrel CD and the number of gas phase etch cycles.

The ammonia adsorption-catalyzed reaction mechanism enables the process to be tuned in way that a uniformly saturated ammonia adsorption layer is formed. This allows a technique to smoothen the silicon nitride surface, therefore improving high frequency roughness of the mandrel CD. Further roughness improvement may be possible by tuning process parameters such as temperature and partial pressure of the reactants during the etch. Further, plasma etch based simultaneous pattern transfer and trim processes generally have inert gas sputtering dependent selectivity. Whereas, the gaseous chemical removal etch, being a plasma-free isotropic gas phase technique, eliminates selectivity limitations as a function of sputtering effects. By separating the pattern transfer process and the trim process, performance advantages may be obtained. Further, gas phase etching techniques allow for etch selectivity that is a function of the film composition and etch chemistry. This enables flexibility towards various alternate integration stacks. For example, Table 1 illustrates potential compatible combinations of etch target layer materials and etch stop layer materials. It will be recognized that such combinations are merely exemplary.

TABLE 1

| Etch Target Layer | Etch Stop Layer |
|---|---|
| Si3N4 | TiN |
| SiO2 | TiN |
| Si3N4 | Si |
| SiO2 | Si |
| Si | SiO2 |
| Si | Si3N4 |
| Si3N4 | Organic Materials |

Thus, other gaseous combinations may be utilized and the chemistry utilized will vary depending upon the makeup of the layer to be trimmed and the underlying layers. For example, a silicon etch target layer may be subject to a gaseous mixture which includes ammonia and a fluorine containing gas. Similarly, a silicon oxide etch target layer may be subject to an ammonia and hydrogen fluoride process. It will be recognized that many other gaseous removal processes may be utilized. Further, it will recognized, after having the benefit of this disclosure, that other isotropic etch processes may be utilized to achieve the nanometer level trim techniques disclosed herein. Moreover, as described herein, the gaseous removal process may be performed cyclically so as to incrementally trim the etch target layer in a controlled manner. In this manner, nanometer level trimming in the linewidth of very narrow lithography processes may be achieved to extend the process margin beyond that repeatedly and accurately achievable though just lithographic exposure. In this manner, the techniques described herein are not limited to just EUV lithography, but rather can be applied to other masking processes in which a nanometer level trimming of linewidth is desired. Further, the techniques described herein allow for such linewidth trimming without causing single line open and high LWR/LER effects.

The gas phase etch critical dimension trim techniques described herein can help alleviate aspect ratio driven roughness. In addition, etch selectivity during pattern transfers trends with critical dimension: Smaller critical dimensions masks erode faster (worse selectivity) compared to larger critical dimensions. Thus being able to transfer a larger critical dimension gives additional selectivity margin during the etch without which one might start seeing high frequency roughness increase due to mask loss during mandrel pattern transfer. The benefits of this approach are thus two folds: low frequency roughness mitigation by post pattern transfer trim and high frequency roughness mitigation by larger critical dimension critical dimension transfer.

It will be recognized that the substrate upon which the structures shown in the figures may be comprised of one or many layers. For example, the substrate may be a semiconductor wafer that has many process layers formed on or in the semiconductor wafer. Thus, for example, the substrate may be a semiconductor wafer at any process step in a semiconductor processing flow. For example, the substrate may comprise a semiconductor wafer and all of its accompanying layers formed up to any particular process step. Further, it will be recognized that the various process layers and structures shown may be utilized with additional intervening process layers and coatings, as would be understood by those in the art. For example, more or less materials may be utilized than that shown in the figures. Thus, it will be recognized that the use of a pattern trimming process in which etch target layer is trimmed may be accomplished within a wide variety of process flows, all of which may advantageously benefit from the characteristics an organic spacer provides. Further, it will be recognized that many of the layers shown in the figures may be considered to be part of the substrate.

Figure 11:
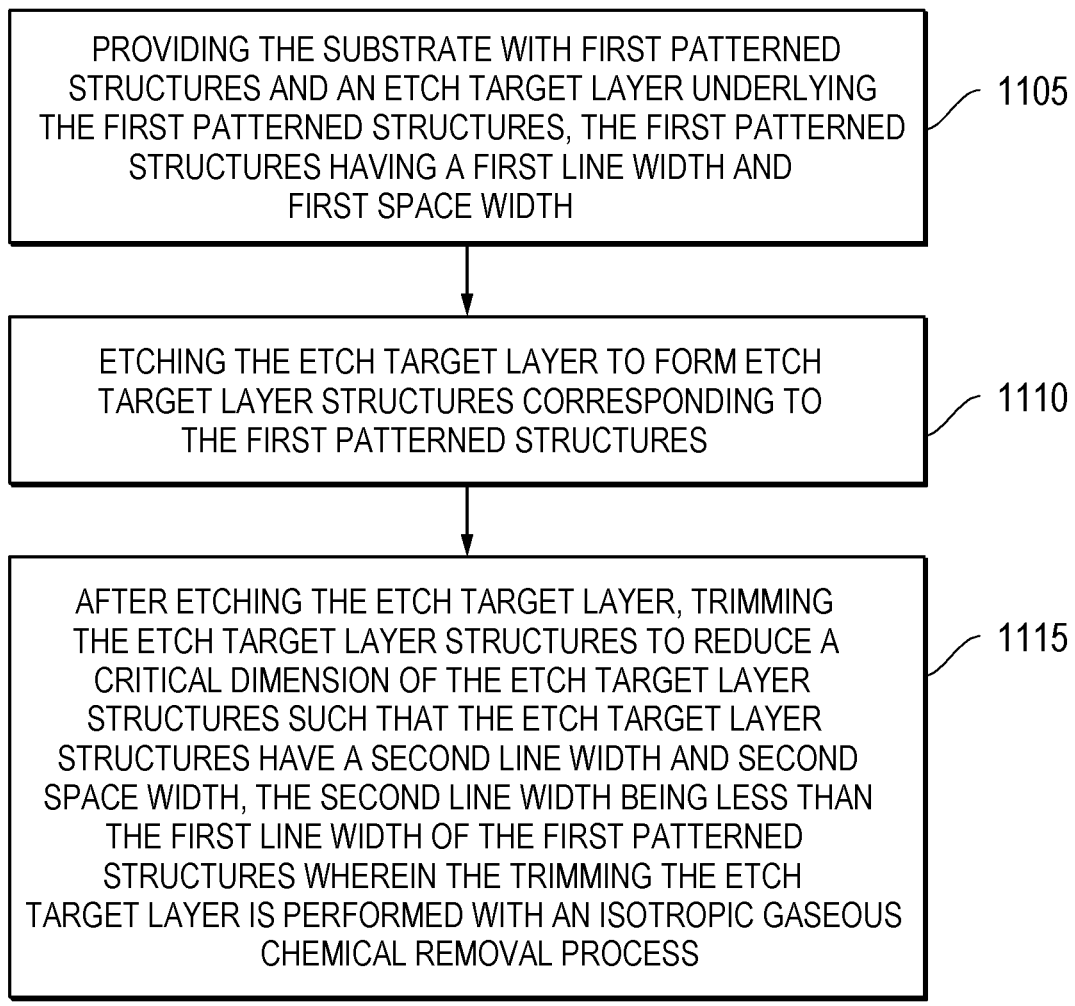
FIGS. 11-13 illustrate exemplary process flows utilizing the techniques described herein.
Figure 12:
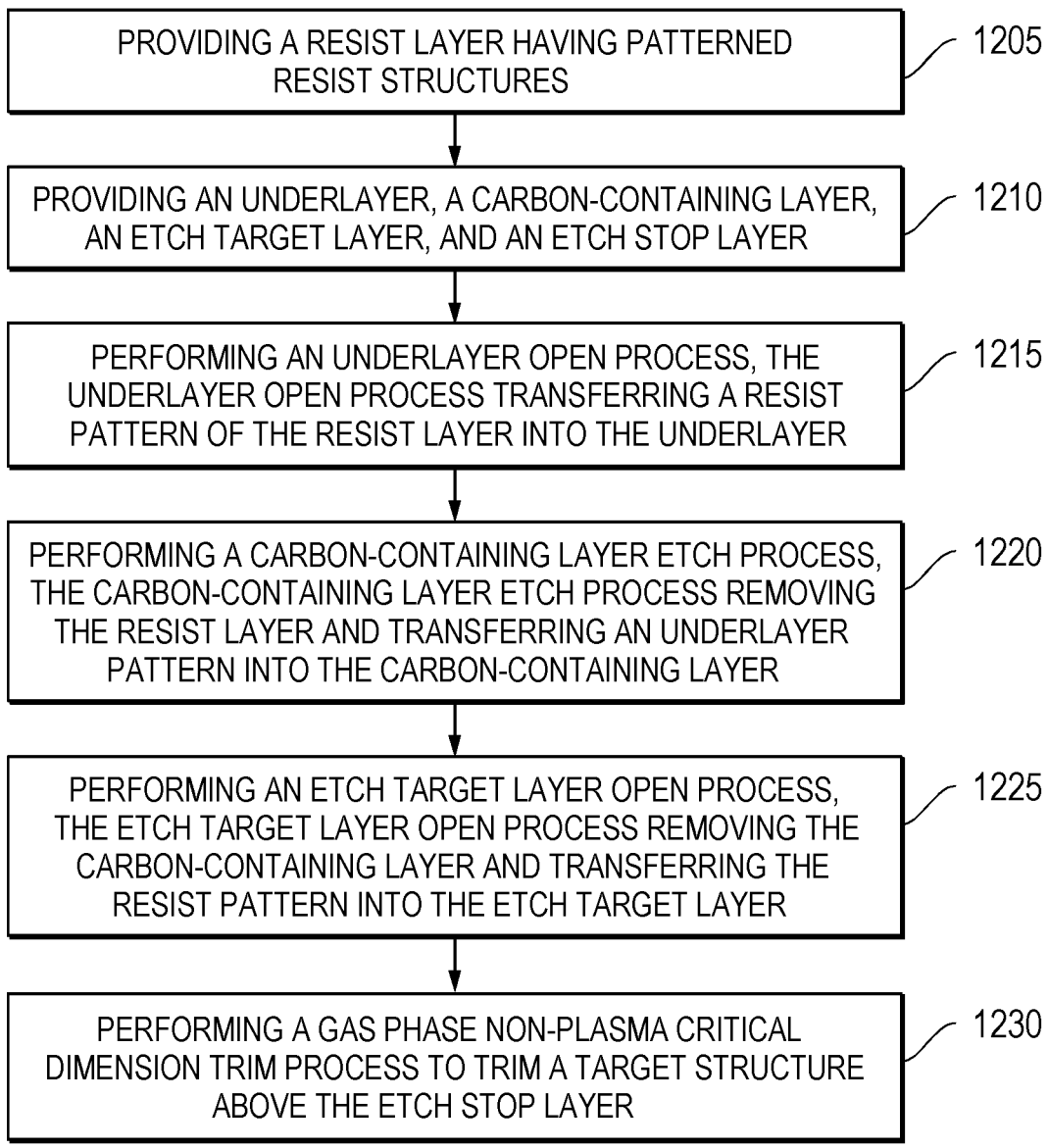
Figure 13:
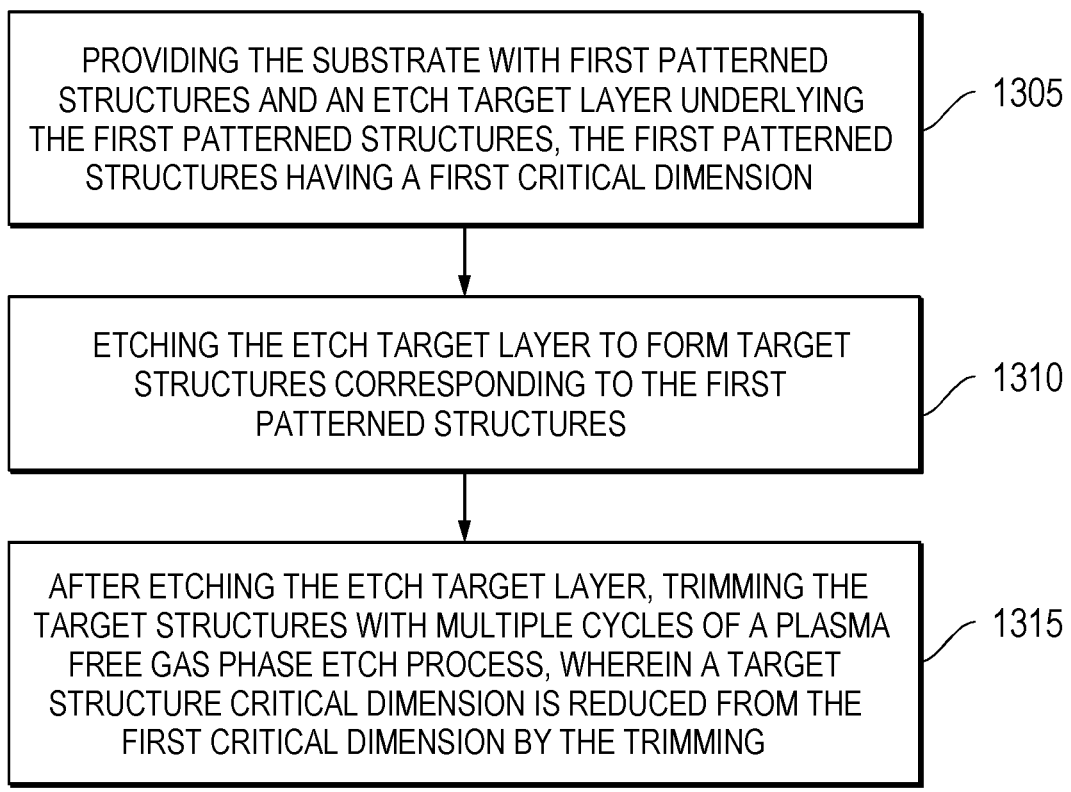

It will be recognized that the process flows described above are merely exemplary, and many other processes and applications may advantageously utilize the techniques disclosed herein. FIGS. 11-13 illustrate exemplary methods for use of the processing techniques described herein. It will be recognized that the embodiments of FIGS. 11-13 are merely exemplary and additional methods may utilize the techniques described herein. Further, additional processing steps may be added to the methods shown in the FIGS. 11-13 as the steps described are not intended to be exclusive. Moreover, the order of the steps is not limited to the order shown in the figures as different orders may occur and/or various steps may be performed in combination or at the same time.

In FIG. 11, a method for processing a substrate is shown. The method includes step 1105 of providing the substrate with first patterned structures and an etch target layer underlying the first patterned structures, the first patterned structures having a first line width and first space width. The method further includes step 1110 of etching the etch target layer to form etch target layer structures corresponding to the first patterned structures. After etching the etch target layer, the method also includes step 1115 of trimming the etch target layer structures to reduce a critical dimension of the etch target layer structures such that the etch target layer structures have a second line width and second space width, the second line width being less than the first line width of the first patterned structures, wherein the trimming the etch target layer is performed with an isotropic gaseous chemical removal process.

In FIG. 12, a method for processing a substrate is shown. The method may include step 1205 of providing a resist layer having patterned resist structures and step 1210 of providing an underlayer, a carbon-containing layer, an etch target layer, and an etch stop layer. The method may further include step 1215 of performing an underlayer open process, the underlayer open process transferring a resist pattern of the resist layer into the underlayer. The method also includes step 1220 of performing a carbon-containing layer etch process, the carbon-containing layer etch process removing the resist layer and transferring an underlayer pattern into the carbon-containing layer. The method also includes step 1225 of performing an etch target layer open process, the etch target layer open process removing the carbon-containing layer and transferring the resist pattern into the etch target layer. The method also includes step 1230 of performing a gas phase non-plasma critical dimension trim process to trim a target structure above the etch stop layer.

In FIG. 13, a method of processing a substrate is shown. The method may comprise step 1305 of providing the substrate with first patterned structures and an etch target layer underlying the first patterned structures, the first patterned structures having a first critical dimension. The method may further comprise step 1310 of etching the etch target layer to form target structures corresponding to the first patterned structures. After etching the etch target layer, the method may comprise step 1315 of trimming the target structures with multiple cycles of a plasma free gas phase etch process, wherein a target structure critical dimension is reduced from the first critical dimension by the trimming.

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and method of the inventions herein shown and described are to be taken as presently preferred embodiments. Equivalent techniques may be substituted for those illustrated and described herein and certain features of the inventions may be utilized independently of the use of other features, all as would be apparent to one skilled in the art after having the benefit of this description of the inventions,

What is claimed is:

1. A method for processing a substrate, comprising:
providing the substrate with first patterned structures, an etch target layer underlying the first patterned structures, and an intervening layer between the first patterned structures and the etch target layer, the first patterned structures having a first line width and first space width;
etching the etch target layer to form etch target layer structures corresponding to the first patterned structures;
after etching the etch target layer, trimming the etch target layer structures to reduce a critical dimension of the etch target layer structures such that the etch target layer structures have a second line width and second space width, the second line width being less than the first line width of the first patterned structures; and
wherein the trimming the etch target layer is performed with an isotropic gaseous chemical removal process; and
wherein:
the intervening layer is opened before etching of the etch target layer to form an intervening patterned layer;
the trimming of the etch target structures is performed with the intervening patterned layer above the etch target structures and the intervening patterned layer is removed after the trimming of the etch target layer;
the trimming of the etch target layer is performed with multiple cycles of the isotropic gaseous chemical removal process, and wherein in each cycle less than 5 nm of the linewidth of each of the etch target structures is removed, and further wherein each cycle includes treating the etch target structures with a first process gas which is adsorbed by the etch target structures followed by treatment with a second process gas to remove portions of the etch target structures at which the first process gas was adsorbed.

2. The method of claim 1, wherein the etch target layer is a mandrel layer.

3. The method of claim 2, wherein the mandrel layer is a silicon nitride layer.

4. The method of claim 1, wherein portions of the intervening layer remain overlying the etch target layer during the isotropic gaseous chemical removal process.

5. The method of claim 1, wherein portions of the intervening layer are removed after the isotropic gaseous chemical removal process.

6. The method of claim 1, wherein the intervening layer is removed prior to the isotropic gaseous chemical removal process.

7. A method for processing a substrate, the method comprising:
providing a resist layer having patterned resist structures;

providing an underlayer, a carbon-containing layer, an etch target layer, and an etch stop layer;

performing an underlayer open process, the underlayer open process transferring a resist pattern of the resist layer into the underlayer;

performing a carbon-containing layer etch process, the carbon-containing layer etch process removing the resist layer and transferring an underlayer pattern into the carbon-containing layer;

performing an etch target layer open process, the etch target layer open process removing the underlayer and transferring the carbon-containing layer pattern into the etch target layer; and after performing the etch target layer open process, performing a gas phase non-plasma critical dimension trimming of target structures above the etch stop layer and below the carbon-containing layer pattern, the trimming of the target structures including performing multiple cycles of a plasma free gas etch process and wherein each cycle includes exposing the target structures to a first process gas which is adsorbed by the target structures followed by exposure to a second process gas which removes portions of the target structures at which the first process gas was adsorbed, and after performing the gas phase non-plasma critical dimension trim process, removing the carbon-containing layer pattern.

8. The method of claim 7, wherein an ash process to remove the carbon-containing layer pattern is performed after performing the gas phase non-plasma critical dimension trimming of the target structures.

9. The method of claim 8, wherein the target structure is a mandrel.

10. The method of claim 8, wherein the gas phase non-plasma critical dimension trimming of the target structures is an ammonia and hydrogen fluoride process.

11. A method for processing a substrate, the method comprising:

providing a resist layer having patterned resist structures;

providing an underlayer, a carbon-containing layer, an etch target layer, and an etch stop layer;

performing an underlayer open process, the underlayer open process transferring a resist pattern of the resist layer into the underlayer;

performing a carbon-containing layer etch process, the carbon-containing layer etch process removing the resist layer and transferring an underlayer pattern into the carbon-containing layer;

performing an etch target layer open process, the etch target layer open process removing the underlayer and transferring the carbon-containing layer pattern into the etch target layer; and performing a gas phase non-plasma critical dimension trim process to trim a target structure above the etch stop layer;

wherein an ash process to remove the carbon-containing layer is performed before performing the gas phase non-plasma critical dimension trim process.

12. The method of claim 11, wherein the target structure is a mandrel.

13. The method of claim 11, wherein the gas phase non-plasma critical dimension trim process is an ammonia and hydrogen fluoride process.

14. A method for processing a substrate, comprising:

providing the substrate with first patterned structures and an etch target layer underlying the first patterned structures, the first patterned structures having a first critical dimension;

etching the etch target layer to form target structures corresponding to the first patterned structures; and after etching the etch target layer, trimming the target structures with multiple cycles of a plasma free gas phase etch process, and wherein each cycle includes exposing the target structures to a first process gas which is adsorbed by the target structures followed by exposure to a second process gas which removes portions of the target structures at which the first process gas was adsorbed, wherein a target structure critical dimension is reduced from the first critical dimension by the trimming.

15. The method of claim 14, wherein the etch target layer is a silicon nitride layer.

16. The method of claim 15, wherein the plasma free gas phase etch process utilizes an ammonia adsorption-catalyzed reaction mechanism.

17. The method of claim 16, wherein the ammonia adsorption-catalyzed reaction mechanism comprises first exposing the target structures to ammonia as the first process gas and then exposing the target structures to a fluorine containing gas as the second process gas.

18. The method of claim 17, further comprising providing an intervening planarization layer between the first patterned structures and the etch target layer, the intervening planarization layer being removed prior to the trimming of the target structures.

19. The method of claim 17, further comprising providing an intervening layer between the first patterned structures and the etch target layer, the intervening layer being removed after the trimming of the target structures such that a portion of the intervening layer is above the target structures during trimming of the target structures, and wherein during each cycle of the multiple cycles less than 5 nm of a linewidth of each of the target structures is removed.

* * * * *